US008472644B2

(12) United States Patent
Chen et al.

(10) Patent No.: US 8,472,644 B2
(45) Date of Patent: Jun. 25, 2013

(54) HIGH EFFICIENCY AUDIO AMPLIFIER AND METHOD THEREOF (75) Inventors: Yi-Shang Chen, Taipei Hsien (TW); Chun-Hao Hsu, Taipei Hsien (TW)

(73) Assignee: Wistron Corporation, New Taipei (TW)

( * ) Notice: Subject to any disclaimer, the term of this patent is extended or adjusted under 35 U.S.C. 154(b) by 502 days.

(21) Appl. No.: 12/792,717

(22) Filed: Jun. 2, 2010

(65) Prior Publication Data

US 2011/0019843 A1 Jan. 27, 2011

(30) Foreign Application Priority Data

Jul. 24, 2009 (TW) .............................. 98125034 A (51) Int. Cl.
*H03F 21/00* (2006.01)
(52) U.S. Cl.
USPC ............................................. 381/120; 330/10
(58) Field of Classification Search
USPC ........ 381/120, 111, 123, 55–59, 28; 330/277, 330/10, 251, 207 P, 207 A
See application file for complete search history.

(56) References Cited

U.S. PATENT DOCUMENTS 5,973,368 A * 10/1999 Pearce et al. .................. 257/368
6,229,389 B1 * 5/2001 Pullen et al. .................... 330/10
2009/0092267 A1 * 4/2009 Wu et al. ........................ 381/120

* cited by examiner

*Primary Examiner* — Lun-See Lao
(74) *Attorney, Agent, or Firm* — Winston Hsu; Scott Margo (57) ABSTRACT

A high efficiency audio amplifier is disclosed. The high efficiency audio amplifier includes an input end for receiving an input audio signal, an output end for outputting an output audio signal, a signal generator coupled to the input end for determining a frequency of an oscillating signal according to the distribution of the input audio signal and a reference voltage, and generating the oscillating signal accordingly, a waveform transformer coupled to the input end and the signal generator for comparing the input audio signal with the oscillating signal to generate a pulse width modulation (PWM) signal, a pre-drive circuit for generating a pre-drive signal according to the PWM signal, an output stage coupled to the pre-drive circuit for generating an output signal, and a filter coupled to the output stage for filtering the output signal to generate the output audio signal to the output end.

27 Claims, 6 Drawing Sheets

HIGH EFFICIENCY AUDIO AMPLIFIER AND METHOD THEREOF

BACKGROUND OF THE INVENTION

1. Field of the Invention

The present invention relates to a high efficiency audio amplifier and method thereof, and more particularly, to an audio amplifier capable of enhancing power efficiency through varying the frequency of the oscillating signal and related method.

2. Description of the Prior Art

Power amplifiers are utilized for increasing the power of signals and are usually classified as A, B, AB, C and D types. The class D amplifier adopts a Pulse-Width Modulation (PWM) technology, which adjusts duty cycles of square waves to represent input values. Also, the power amplifiers offer advantages of small size, high efficiency, and energy savings so that the class D power amplifier has widely been applied in various electronic products, such as notebooks, LCD monitors, mobile phones, and multimedia players, etc.

Figure 1A:
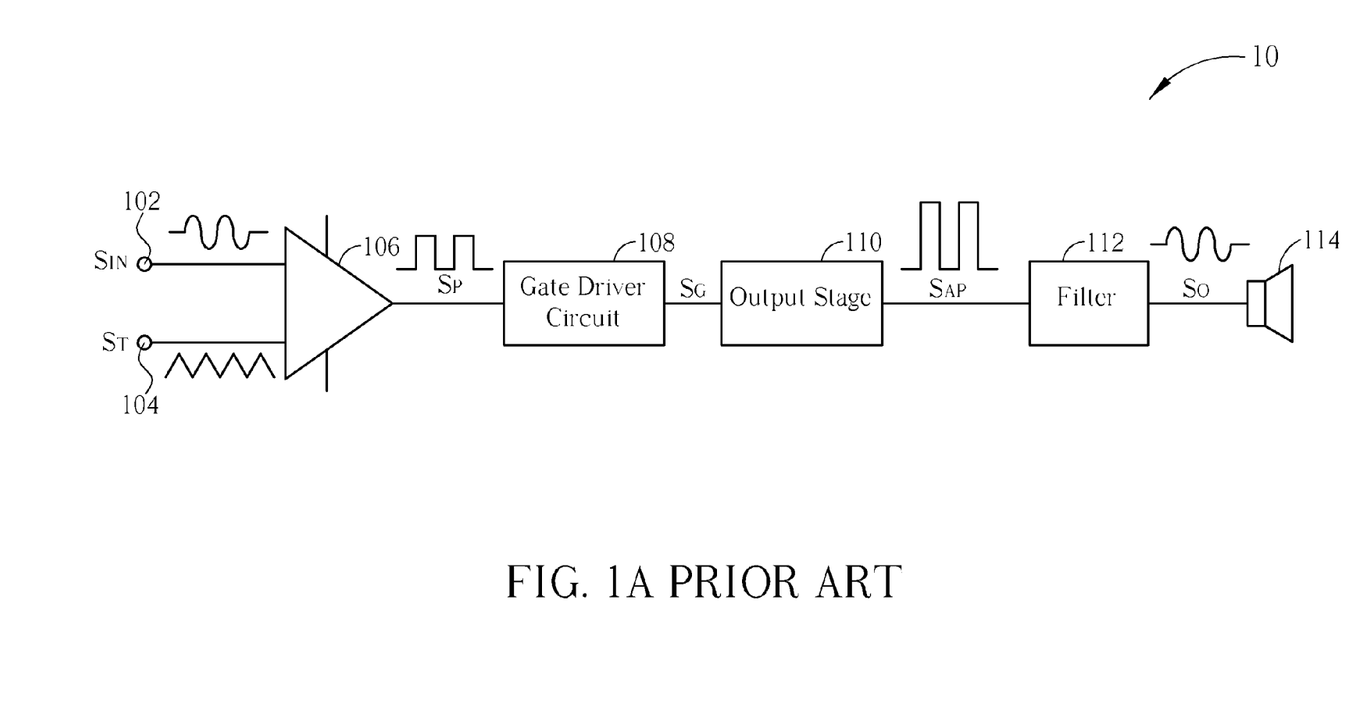
FIG. 1A is a schematic diagram of a class D power amplifier according to the prior art.

Please refer to FIG. 1A, which is a schematic diagram of a class D power amplifier 10 according to the prior art. The class D power amplifier 10 includes an input end 102, a reference signal end 104, a comparator 106, a gate driver circuit 108, an output stage 110, a filter 112, and a speaker 114. The input end 102 is utilized for receiving an input audio signal $S_{IN}$. The reference signal end 104 is utilized for receiving a triangular reference signal $S_T$. The comparator 106 is utilized for performing a comparison operation on the input audio signal $S_{IN}$ and the triangular reference signal $S_T$ to generate a PWM signal $S_P$, and transmitting the PWM signal $S_P$ to the gate driver circuit 108. After that, the gate driver circuit 108 generates a gate drive signal $S_G$ according to the PWM signal $S_P$ for driving the output stage 110. Furthermore, the output stage 110 outputs an output signal $S_{AP}$ according to the gate drive signal $S_G$. The filter 112 filters the output signal $S_{AP}$ to output an output audio signal $S_O$. Finally, the output audio signal $S_O$ is transmitted to the speaker 114 for playing.

Figure 1B:
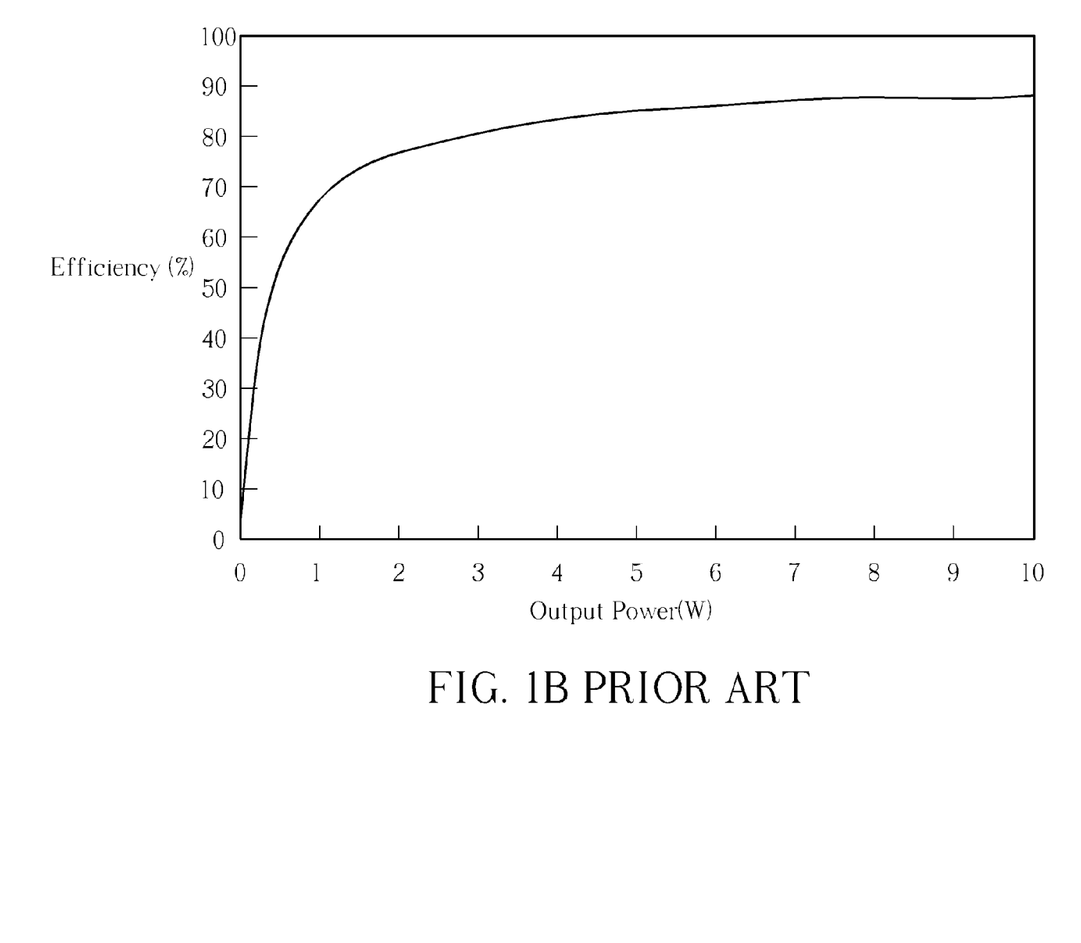
FIG. 1B is a schematic diagram of operation efficiency of the class D power amplifier shown in FIG. 1A.

Please refer to FIG. 1B, which is a schematic diagram of the operation efficiency of the class D power amplifier 10. Compared with other types of power amplifiers, the class D power amplifier 10 is able to achieve much higher power efficiency, above 90%, for high output power situation in practice. However, as shown, in FIG. 1B, the class D power amplifier 10 can not achieve good power efficiency as well in a low output power situation. How to figure out a method for enhancing power efficiency in a low output power situation should be a concern in the progressive application design.

SUMMARY OF THE INVENTION

The present invention provides a high efficiency audio amplifier and a method thereof.

According to an embodiment of the invention, a high efficiency audio amplifier is disclosed. The high efficiency audio amplifier, includes an input end for receiving an input audio signal; an output end for outputting an output audio signal; a signal generator coupled to the input end for determining a frequency of an oscillating signal according to the distribution of the input audio signal and a reference voltage, and generating the oscillating signal accordingly; a waveform transformer coupled to the input end and the signal generator for comparing the input audio signal with the oscillating signal to generate a pulse width modulation (PWM) signal; a pre-drive circuit coupled to the waveform transformer for generating a pre-drive signal according to the PWM signal; an output stage coupled to the pre-drive circuit for generating an output signal; and a filter coupled to the output stage for filtering the output signal to generate the output audio signal to the output end.

According to an embodiment of the invention, a method for enhancing efficiency of an audio amplifier is disclosed. The method includes determining a frequency of an oscillating signal according to distribution of an input audio signal and a reference voltage, and generating the oscillating signal accordingly; comparing the input audio signal with the oscillating signal to generating a pulse width modulation (PWM) signal; generating a pre-drive signal according to the PWM signal; generating an output signal according to the pre-drive signal; and filtering the output signal to generate an output audio signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
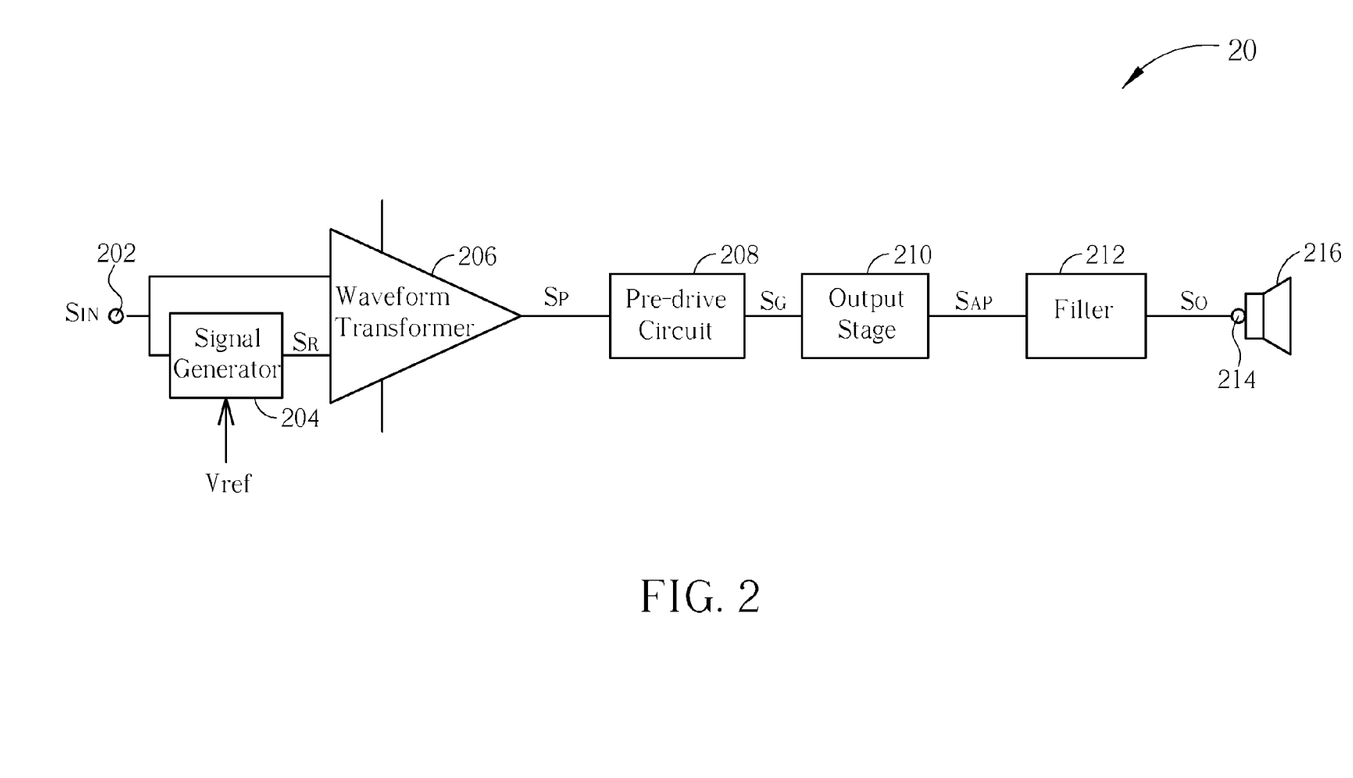
FIG. 2 is a schematic diagram of an audio amplifier according to an embodiment of the present invention.

Please refer to FIG. 2, which is a schematic diagram of an audio amplifier 20 according to an embodiment of the present invention. The audio amplifier 20 includes an input end 202, a signal generator 204, a waveform transformer 206, a pre-drive circuit 208, an output stage 210, a filter 212, an output end 214, and a speaker 216. The input end 202 is utilized for receiving an input audio signal $S_{IN}$. The signal generator 204 is coupled to the input end 202 for determining a frequency of an oscillating signal $S_R$ according to the distribution of the input audio signal $S_{IN}$ and a reference voltage $V_{ref}$, and generating the oscillating signal $S_R$ accordingly. The waveform transformer 206 is coupled to the input end 202 and the signal generator 204 for comparing the input audio signal $S_{IN}$ with the oscillating signal $S_R$ to generate a pulse width modulation (PWM) signal $S_P$. The pre-drive circuit 208 is coupled to the waveform transformer 206 for generating a pre-drive signal $S_G$ according to the PWM signal $S_P$. The output stage 210 is coupled to the pre-drive circuit 208 for generating an output signal $S_{AP}$ according to the pre-drive signal $S_G$. The filter 212 is coupled to the output stage 210 for filtering the output signal $S_{AP}$ to generate an output audio signal $S_O$ to the output end 214. Moreover, the output audio signal $S_O$ can be outputted to the speaker 216 via the output end 214 for play. In other words, the signal generator 204 can adjust the frequency of the oscillating signal $S_R$ according to the input audio signal $S_{IN}$ for enhancing the power efficiency of the audio amplifier 20.

In general, power efficiency of a power amplifier is inversely proportion to power loss. The power loss $P_{loss}$ usually includes three portions, i.e. transistor switching loss $P_{sw}$, transistor conduction loss $P_{cond}$, and parasitic capacitance loss $P_{gd}$ of the power amplifier. Therefore, the power loss $P_{loss}$ can be expressed as follows:

$$P_{loss} = P_{sw} + P_{cond} + P_{gd} = \underbrace{(C_{oss} * V_{BUS}^2 * f_{pwm} + I_D * t_f * f_{pwm})}_{P_{sw}} + \underbrace{\left(\frac{R_{DS}}{R_L} * P_O\right)}_{P_{cond}} + \underbrace{(2 * Q_g * V_{gs} * f_{pwm})}_{P_{gd}} \quad (1)$$

where $C_{OSS}$ represents output capacitance of transistor, $V_{BUS}$ represents supplied voltage of transistor, $I_D$ is conduct current, $t_f$ represents rise and fall time of pulse signal, $f_{pwm}$ represents modulation frequency of the PWM signal $S_P$, $R_L$ is load impedance, $R_{DS}$ represents conducting impedance of transistor, $P_O$ is output power, $Q_g$ represents gate charge of transistor, and $V_{gs}$ represents conducting voltage of transistor. From the equation (1), the above-mentioned parameters are fixed values in practice. Thus, the present invention is capable of improving the power loss $P_{loss}$ through varying modulation frequency $f_{pwm}$ of the PWM signal $S_P$. Furthermore, the variation of the modulation frequency $f_{pwm}$ of the PWM signal $S_P$ is due to the variation of the frequency of the oscillating signal $S_R$. As can be seen, the present invention can improve the power loss $P_{loss}$ through adjusting the frequency of the oscillating signal $S_R$ (resulting in the variation of modulation frequency $f_{pwm}$ of the PWM signal $S_P$) so as to control the power efficiency of the audio amplifier 20. For example, the present invention is able to decrease the power loss $P_{loss}$ by decreasing the frequency of the oscillating signal $S_R$ to enhance the power efficiency of the audio amplifier 20.

Figure 3:
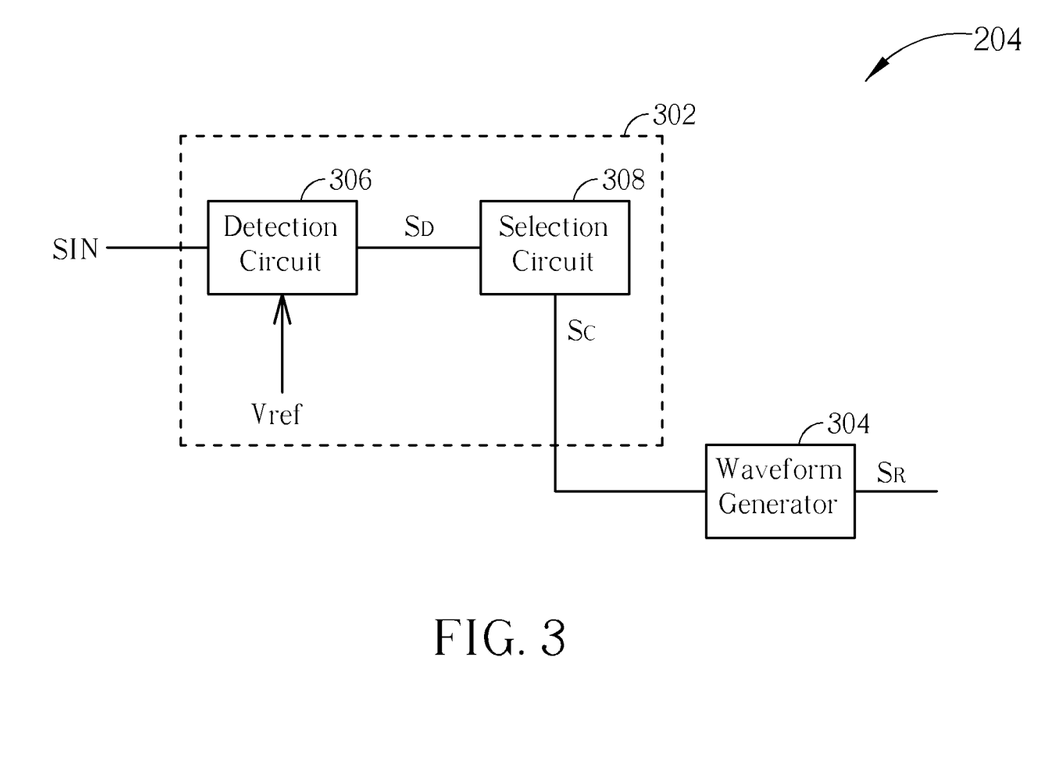
FIG. 3 is a schematic diagram of the signal generator shown in FIG. 2.

On the other hand, in a class D audio amplifier, the output audio signal is usually proportional to the input audio signal. To solve the problem of poor power efficiency for a low output power situation, the present invention adjusts the frequency of the oscillating signal $S_R$ according to signal magnitude of the input audio signal $S_{IN}$. Please further refer to FIG. 3. FIG. 3 is a schematic diagram of the signal generator 204 shown in FIG. 2. The signal generator 204 includes a determination circuit 302 and a waveform generator 304. The determination circuit 302 is coupled to the input end 202 for determining the frequency of the oscillating signal $S_R$ according to the distribution of the input audio signal $S_{IN}$ and the reference voltage $V_{ref}$. When the input audio signal $S_{IN}$ is greater (smaller) than the reference voltage $V_{ref}$, the determination circuit 302 is capable of increasing (decreasing) the frequency of the oscillating signal $S_R$ and further generating the corresponding control signal $S_C$ accordingly. Take the input audio signal $S_{IN}$ with a continuous sinusoidal wave form as example, when the time proportion that the signal magnitude of the input audio signal $S_{IN}$ is greater (smaller) than the reference voltage $V_{ref}$ is greater than a first predetermined value, the determination circuit 302 increases (decreases) the frequency of the oscillating signal $S_R$. Optionally, the determination circuit 302 increases (decreases) the frequency of the oscillating signal $S_R$, when the average of the input audio signal $S_{IN}$ is greater (smaller) than the reference voltage $V_{ref}$, and this should not be a limitation of the present invention. In short, according to the signal characteristics of the input audio signal $S_{IN}$, the present invention can improve the power efficiency for low output power situation through arranging the frequency of the oscillating signal $S_R$.

The following further elaborates the determination circuit 302 shown in FIG. 3. The determination circuit 302 includes a detection circuit 306 and a selection circuit 308. The detection circuit 306 is coupled to the input end 202 for determining the distribution of the input audio signal $S_{IN}$ according to the input audio signal $S_{IN}$ and the reference voltage $V_{ref}$ to generate a detection signal $S_D$. The selection circuit 308 is coupled to the detection circuit 306 and the waveform generator 304 for selecting the frequency of the oscillating signal $S_R$ according to the detection signal $S_D$ and generating the control signal $S_C$ accordingly. For example, the selection circuit 308 can be implemented by a multiplexer. After receiving the detection signal $S_D$, the selection circuit 308 selects the control signal $S_C$ from a plurality of candidate control signals indicating various frequencies of the oscillating signal $S_R$ according to the detection signal $S_D$, and provides the control signal $S_C$ to the waveform generator 304. Again, the waveform generator 304 generates the corresponding oscillating signal $S_R$ according to the control signal $S_C$.

Figure 4:
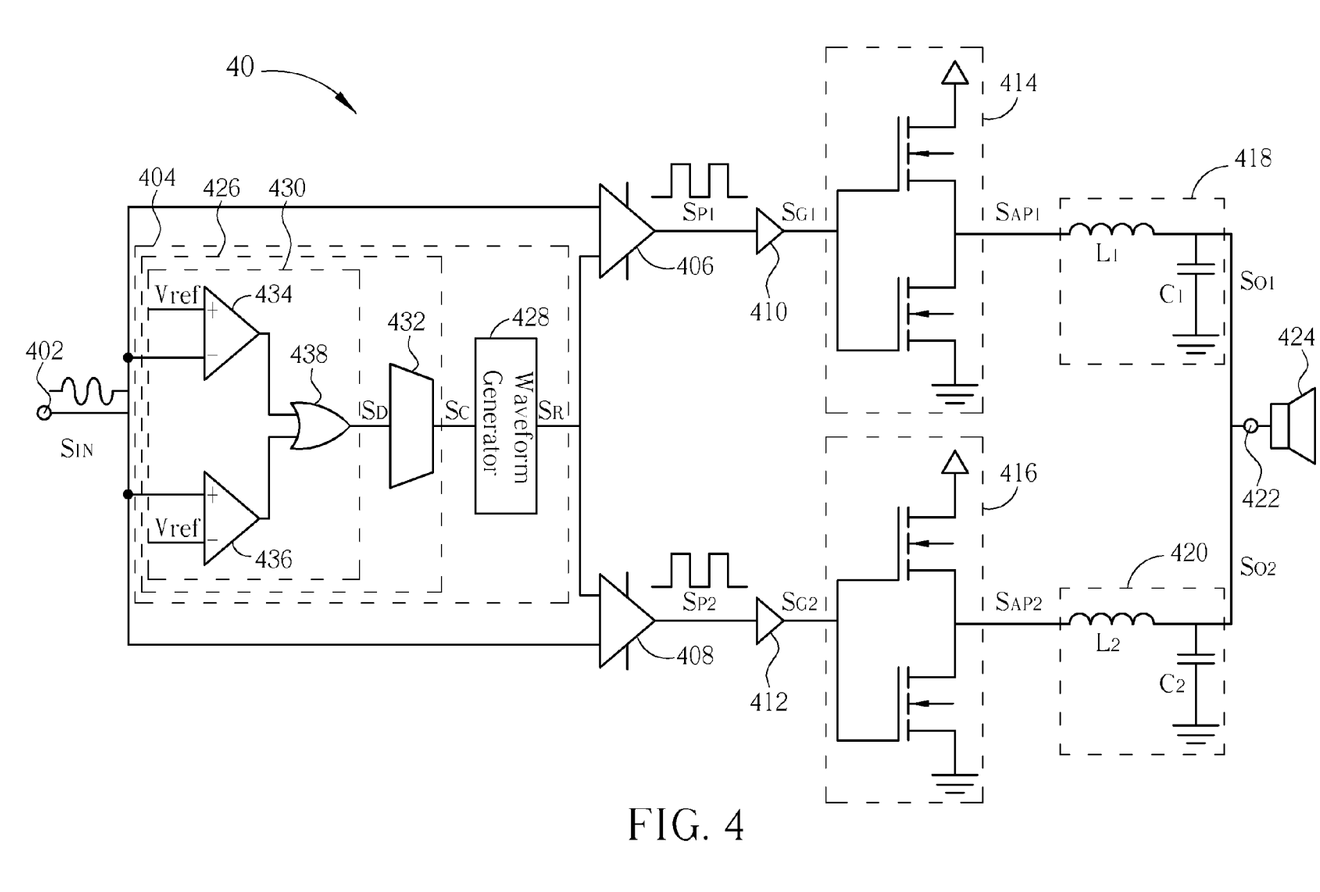
FIG. 4 is a schematic diagram of an audio amplifier having dual channels according to an embodiment of the present invention.

Note that, the audio amplifier 20 represents exemplary embodiments of the present invention and those skilled in the art can make alternations and modifications accordingly. For example, please refer to FIG. 4, which is a schematic diagram of an audio amplifier 40 having dual channels according to an embodiment of the present invention. Please note that the audio amplifier 40 shown in FIG. 4 with the same designations as those in the audio amplifier 20 shown in FIG. 2 have similar operations and functions and further description is omitted for brevity. The interconnections of the units are as shown in FIG. 4. The audio amplifier 40 includes an input end 402, a signal generator 404, waveform transformers 406 and 408, pre-drive circuits 410 and 412, output stages 414 and 416, filters 418 and 420, an output end 422, and a speaker 424. The signal generator 404 includes a determination circuit 426 and a waveform generator 428. The determination circuit 426 includes a detection circuit 430 and a selection circuit 432. The detection circuit 430 includes a first comparator 434, a second comparator 436, and an OR gate 438. The detection circuit 430 utilizes the first comparator 434 and the second comparator 436 to generate a first comparative result and a second comparative result. After that, the OR gate 438 performs a logical OR operation on the first comparative result and the second comparative result to generate the detection signal $S_D$ to the waveform generator 428. As shown in FIG. 4, a positive end and a negative end of the first comparator 434 are utilized for receiving the reference voltage $V_{ref}$ and the input audio signal $S_{IN}$ respectively, and the first comparative result of the reference voltage $V_{ref}$ and the input audio signal $S_{IN}$ is outputted from an output end of the first comparator 434. A positive end and a negative end of the second comparator 436 are utilized for receiving the input audio signal $S_{IN}$ and the reference voltage $V_{ref}$ respectively, and the first comparative result of the reference voltage $V_{ref}$ and the input audio signal $S_{IN}$ is outputted from an output end of the second comparator 436. In other words, the detection circuit 430 is capable of estimating whether the absolute value of the signal magnitude of the input audio signal $S_{IN}$ is greater than the reference voltage $V_{ref}$ to select the corresponding frequency of the oscillating signal $S_R$ accordingly, though it should be obvious to one familiar with the art that the detection circuit 430 could be implemented by any method or device. In addition, the selection circuit 432 can be a multiplexer. The output stages 414 and 416 can be a totem pole output formed by the series connection of a pair of metal oxide semiconductor transistors separately. The filters 418 and 420 can be low pass filters including inductor L1 and capacitor C1, and inductor L2 and capacitor C2 respectively.

Preferably, in the present invention, the components of the audio amplifier, such as the pre-drive circuit, output stage, or filter, can be varied or modified in accordance with various application situations. The reference signal $V_{ref}$ is capable of a direct current voltage. The oscillating signal SR can be a triangular wave signal, a sawtooth wave signal, or any other oscillation signal depending on system designs. In addition, according to the various amounts of audio channels, the audio amplifier 20, 40 can be varied and modified accordingly by those skilled in the art.

Figure 5:
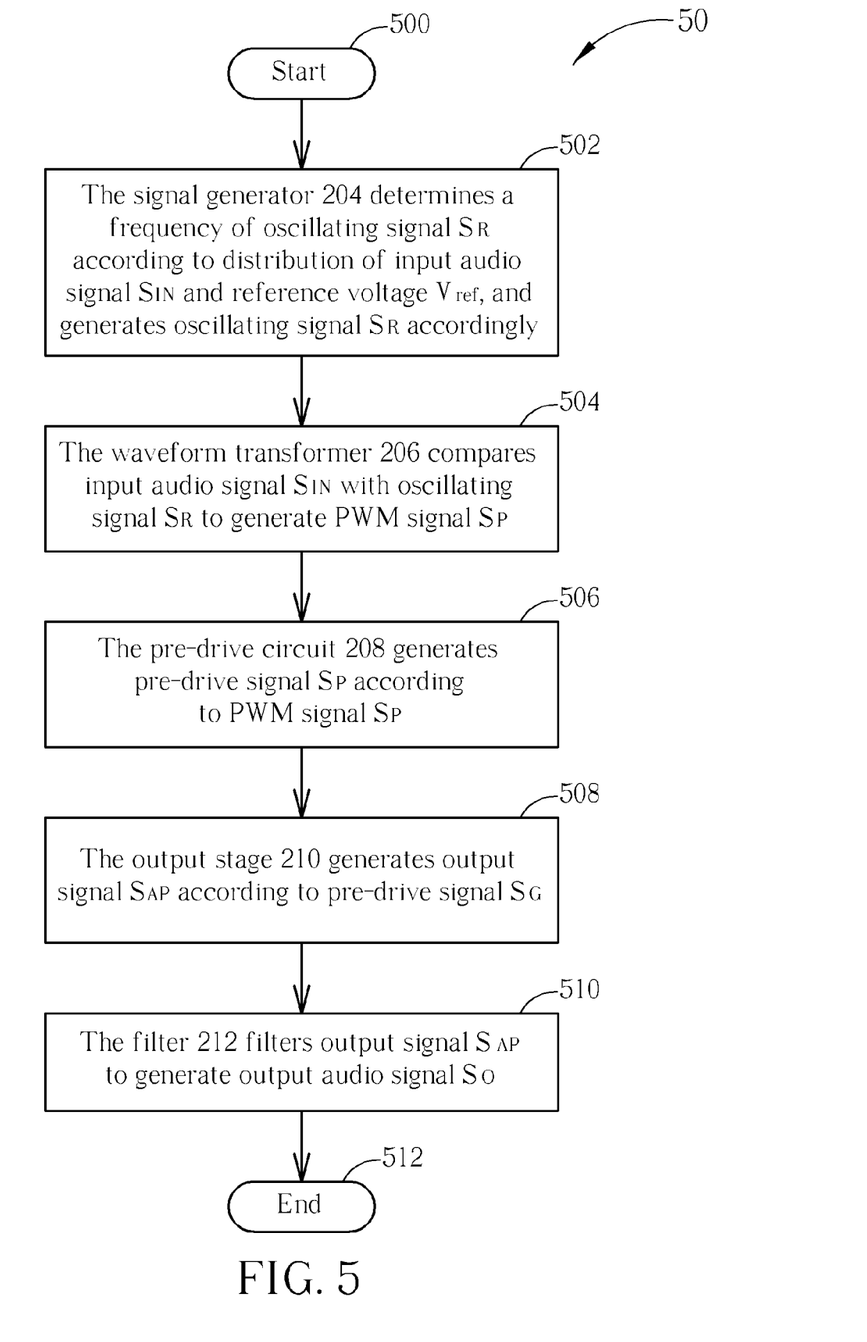
FIG. 5 is a schematic diagram of a procedure according to an embodiment of the present invention.

As to the operating method of the audio amplifier 20, please refer to FIG. 5. FIG. 5 is a schematic diagram of a procedure 50 according to an embodiment of the present invention. The procedure 50 comprises the following steps:

Step 500: Start.

Step 502: The signal generator 204 determines a frequency of oscillating signal $S_R$ according to distribution of input audio signal $S_{IN}$ and reference voltage $V_{ref}$, and generates oscillating signal $S_R$ accordingly.

Step 504: The waveform transformer 206 compares input audio signal $S_{IN}$ with oscillating signal $S_R$ to generate PWM signal $S_P$.

Step 506: The pre-drive circuit 208 generates pre-drive signal $S_P$ according to PWM signal $S_P$.

Step 508: The output stage 210 generates output signal $S_{AP}$ according to pre-drive signal $S_G$.

Step 510: The filter 212 filters output signal $S_{AP}$ to generate output audio signal $S_O$.

Step 512: End.

The procedure 50 is utilized for illustrating the implementation of the audio amplifier 20. Related variations and the detailed description can be referred from the foregoing description, so as not to be narrated herein.

In summary, the present invention is capable of flexibly adjusting the frequency of the oscillating signal according to the signal characteristics of the input audio signal to decrease the power loss and improve power efficiency of power amplifier.

Those skilled in the art will readily observe that numerous modifications and alterations of the device and method may be made while retaining the teachings of the invention.

What is claimed is:

1. A high efficiency audio amplifier, comprising:
an input end for receiving an input audio signal;
an output end for outputting an output audio signal;
a signal generator, comprising:
  a determination circuit coupled to the input end for determining a frequency of an oscillating signal according to the distribution of the input audio signal and a reference voltage and generating a control signal accordingly; and
  a waveform generator coupled to the determination circuit for generating the oscillating signal according to the control signal;
a waveform transformer coupled to the input end and the signal generator for comparing the input audio signal with the oscillating signal to generate a pulse width modulation (PWM) signal;
a pre-drive circuit coupled to the waveform transformer for generating a pre-drive signal according to the PWM signal;
an output stage coupled to the pre-drive circuit for generating an output signal; and
a filter coupled to the output stage for filtering the output signal to generate the output audio signal to the output end;

wherein the determination circuit increases the frequency of the oscillating signal and generates the control signal accordingly when the input audio signal is greater than the reference voltage.

2. The high efficiency audio amplifier of claim 1, wherein the determination circuit increases the frequency of the oscillating signal and generates the control signal accordingly when the time proportion that the input audio signal is greater than the reference voltage is higher than a first predetermined value.

3. The high efficiency audio amplifier of claim 1, wherein the determination circuit increases the frequency of the oscillating signal and generates the control signal accordingly when the average of the input audio signal is greater than the reference voltage.

4. The high efficiency audio amplifier of claim 1, wherein the determination circuit decreases the frequency of the oscillating signal and generates the control signal accordingly when the input audio signal is smaller than the reference voltage.

5. The high efficiency audio amplifier of claim 4, wherein the determination circuit decreases the frequency of the oscillating signal and generates the control signal accordingly when the time proportion that the input audio signal is smaller than the reference voltage is higher than a second predetermined value.

6. The high efficiency audio amplifier of claim 4, wherein the determination circuit decreases the frequency of the oscillating signal and generates the control signal accordingly when the average of the input audio signal is smaller than the reference voltage.

7. The high efficiency audio amplifier of claim 1, wherein the determination circuit comprises:
a detection circuit coupled to the input end for determining the distribution of the input audio signal according to the input audio signal and the reference voltage to generate a detection signal; and
a selection circuit coupled to the detection circuit and the waveform generator for selecting the frequency of the oscillating signal according to the detection signal and generating the control signal accordingly.

8. The high efficiency audio amplifier of claim 7, wherein the detection circuit comprises:
a first comparator comprising a positive input terminal for receiving the reference voltage, a negative input terminal coupled to the input end for receiving the input audio signal, and an output terminal for outputting a first comparative result of the positive input terminal and the negative input terminal;
a second comparator comprising a positive input terminal coupled to the input end for receiving the input audio signal, a negative input terminal for receiving the reference voltage, and an output terminal for outputting a second comparative result of the positive input terminal and the negative input terminal; and
an OR gate coupled to the output terminal of the first comparator, the output terminal of the second comparator, and the selection circuit for performing a logical OR operation on the first comparative result and the second comparative result to generate the detection signal.

9. The high efficiency audio amplifier of claim 7, wherein the selection circuit comprises:
a multiplexer coupled to the detection circuit and the waveform generator for selecting the control signal from a plurality of candidate control signals indicating various frequencies of the oscillating signal according to the detection signal and providing the control signal to the waveform generator.

10. The high efficiency audio amplifier of claim 1, wherein the output stage comprises:
a first transistor comprising a first terminal coupled to the pre-drive circuit for receiving the pre-drive signal, a second terminal, and a third terminal coupled to a power source, for controlling an electrical connection between the second terminal of the first transistor and the third terminal of the first transistor according to a signal from the first terminal of the first transistor; and
a second transistor comprising a first terminal coupled to the pre-drive circuit for receiving the pre-drive signal, a second terminal coupled to a ground end, and a third terminal coupled to the second terminal of the first transistor, for controlling an electrical connection between the second terminal of the second transistor and the third terminal of the second transistor according to a signal from the first terminal of the second transistor;
wherein the filter is coupled to the second terminal of the first transistor and the third terminal of the second transistor output stage for outputting the output audio signal.

11. The high efficiency audio amplifier of claim 10, wherein the first transistor is an n-type metal oxide semiconductor transistor, the first terminal of the first transistor is a gate, the second terminal of the first transistor is a source, and the third terminal of the first transistor is a drain.

12. The high efficiency audio amplifier of claim 10, wherein the second transistor is an n-type metal oxide semiconductor transistor, the first terminal of the second transistor is a gate, the second terminal of the second transistor is a source, and the third terminal of the second transistor is a drain.

13. The high efficiency audio amplifier of claim 1, wherein the filter is a low pass filter.

14. The high efficiency audio amplifier of claim 1, wherein the reference signal is a direct current voltage.

15. The high efficiency audio amplifier of claim 1, wherein the oscillating signal is a triangular wave signal or a sawtooth wave signal.

16. The high efficiency audio amplifier of claim 1 further comprising:
a speaker coupled to the output end for playing the output audio signal.

17. A method for enhancing efficiency of an audio amplifier, comprising:
determining a frequency of an oscillating signal according to distribution of an input audio signal and a reference voltage, and generating a control signal accordingly;
generating the oscillating signal according to the control signal;
comparing the input audio signal with the oscillating signal to generating a pulse width modulation (PWM) signal;
generating a pre-drive signal according to the PWM signal;
generating an output signal according to the pre-drive signal; and
filtering the output signal to generate an output audio signal;
wherein the step of determining the frequency of the oscillating signal according to the distribution of the input audio signal and the reference voltage and generating the control signal accordingly comprises increasing the frequency of the oscillating signal and generating the control signal accordingly when the input audio signal is greater than the reference voltage.

18. The method of claim 17, wherein the step of determining the frequency of the oscillating signal according to the distribution of the input audio signal and the reference voltage and generating a control signal accordingly comprises:
increasing the frequency of the oscillating signal and generating the control signal accordingly when the time proportion that the input audio signal is greater than the reference voltage is higher than a first predetermined value.

19. The method of claim 17, wherein the step of determining the frequency of the oscillating signal according to the distribution of the input audio signal and the reference voltage and generating a control signal accordingly comprises:
increasing the frequency of the oscillating signal and generating the control signal accordingly when the average of the input audio signal is greater than the reference voltage.

20. The method of claim 17, wherein the step of determining the frequency of the oscillating signal according to the distribution of the input audio signal and the reference voltage and generating a control signal accordingly comprises:
decreasing the frequency of the oscillating signal and generates the control signal accordingly when the input audio signal is smaller than the reference voltage.

21. The method of claim 20, wherein the step of determining the frequency of the oscillating signal according to the distribution of the input audio signal and the reference voltage and generating a control signal accordingly comprises:
decreasing the frequency of the oscillating signal and generates the control signal accordingly when the time proportion that the input audio signal is smaller than the reference voltage is higher than a second predetermined value.

22. The method of claim 20, wherein the step of determining the frequency of the oscillating signal according to the distribution of the input audio signal and the reference voltage and generating a control signal accordingly comprises:
decreasing the frequency of the oscillating signal and generates the control signal accordingly when the average of the input audio signal is smaller than the reference voltage.

23. The method of claim 17, wherein the step of determining the frequency of the oscillating signal according to the distribution of the input audio signal and the reference voltage and generating a control signal accordingly comprises:
determining the distribution of the input audio signal according to the input audio signal and the reference voltage to generate a detection signal; and
selecting a frequency of the oscillating signal according to the detection signal and generating the control signal accordingly.

24. The method of claim 23, wherein the step of determining the distribution of the input audio signal according to the input audio signal and the reference voltage to generate the detection signal comprises:
comparing whether the positive edge and the negative edge of the input audio signal is greater than the reference signal respectively to generate a first comparative result and a second comparative result; and
performing a logical OR operation on the first comparative result and the second comparative result and generating the control signal accordingly.

25. The method of claim 23, wherein the step of selecting the frequency of the oscillating signal according to the detection signal and generating the control signal accordingly comprises:

selecting the control signal from a plurality of candidate control signals indicating various frequencies of the oscillating signal according to the detection signal.

26. The method of claim 17, wherein the reference signal is a direct current voltage.

27. The method of claim 17, wherein the oscillating signal is a triangular wave signal or a sawtooth wave signal.

* * * * *